United States Patent [19]
McDermott

[11] Patent Number: 5,898,267
[45] Date of Patent: Apr. 27, 1999

[54] PARABOLIC AXIAL LIGHTING DEVICE

[76] Inventor: Kevin McDermott, 196 Phillips Dr., Hampstead, Md. 21074

[21] Appl. No.: 08/631,821

[22] Filed: Apr. 10, 1996

[51] Int. Cl.$^6$ .............................. H01J 5/16; H01J 61/40; H01K 1/26; H01K 1/30

[52] U.S. Cl. ................... 313/512; 313/110; 313/112; 313/113; 362/311; 362/339; 362/800

[58] Field of Search ..................... 313/512, 110, 313/112, 113; 362/311, 339, 800, 493, 634

[56] References Cited

U.S. PATENT DOCUMENTS

| | | | |
|---|---|---|---|
| 1,880,892 | 10/1932 | Dodge | 362/255 |
| 1,977,689 | 10/1934 | Muller | 362/327 |
| 2,215,900 | 9/1940 | Bitner | 362/309 |
| 2,224,178 | 12/1940 | Bitner | 362/337 |
| 2,254,961 | 9/1941 | Harris | 362/327 |
| 2,254,962 | 9/1941 | Harris et al. | 362/327 |
| 2,356,654 | 8/1944 | Cullman | 362/327 |
| 2,362,176 | 11/1944 | Swanson | 313/110 |
| 2,469,080 | 5/1949 | Rosin et al. | 362/327 |
| 4,698,730 | 10/1987 | Sakai et al. | 362/311 |
| 5,140,220 | 8/1992 | Hasegawa | 362/300 |
| 5,452,190 | 9/1995 | Priesemuth | 362/255 |

Primary Examiner—Sandra O'Shea
Assistant Examiner—Mack Haynes

[57] ABSTRACT

A compact lighting device including a light concentrating reflector directing side light emitted by a light source towards a light refracting surface where it is refracted and thereby redirected. The light refracting surface is contoured and positioned to cooperate with the contour of light concentrating reflector such that after passing through the refracting surface the emerging light forms a light beam concentrated about an axis. An optional light refracting lens can be included to compliment the reflector and refractor combination by redirecting forward light emitted by the light source to further increase the intensity of the concentrated light beam.

16 Claims, 4 Drawing Sheets

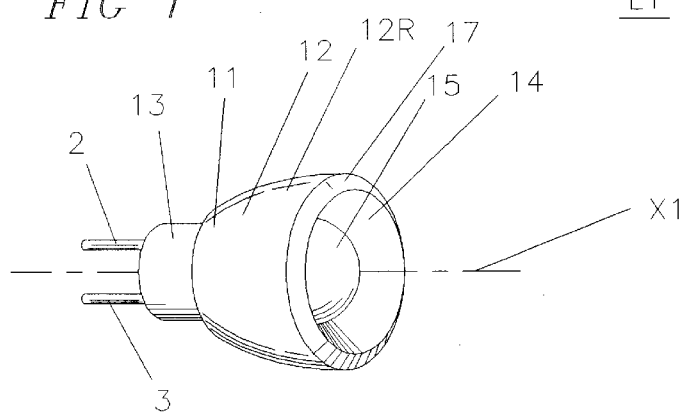
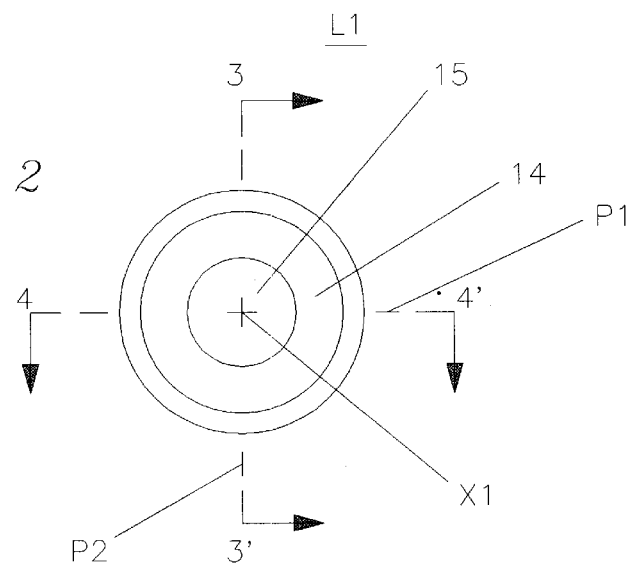
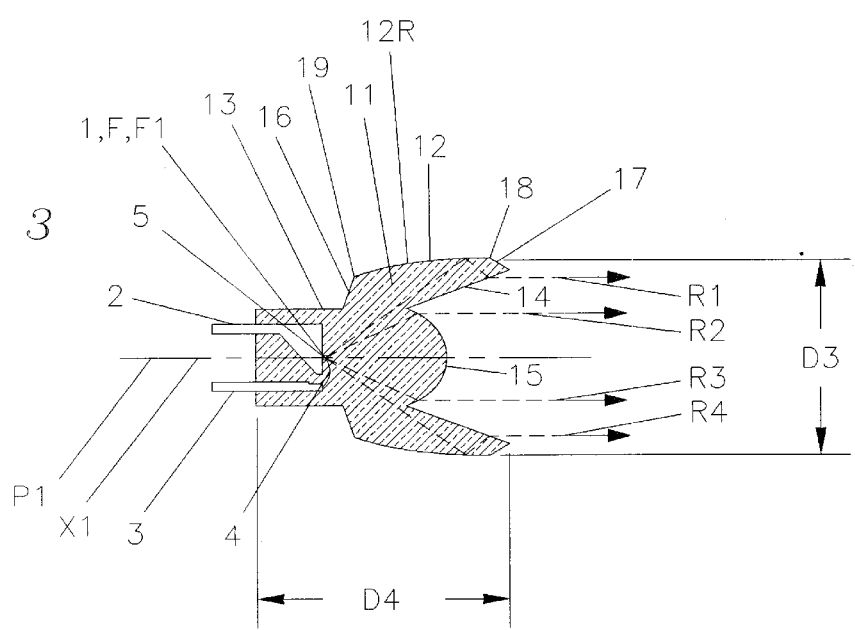

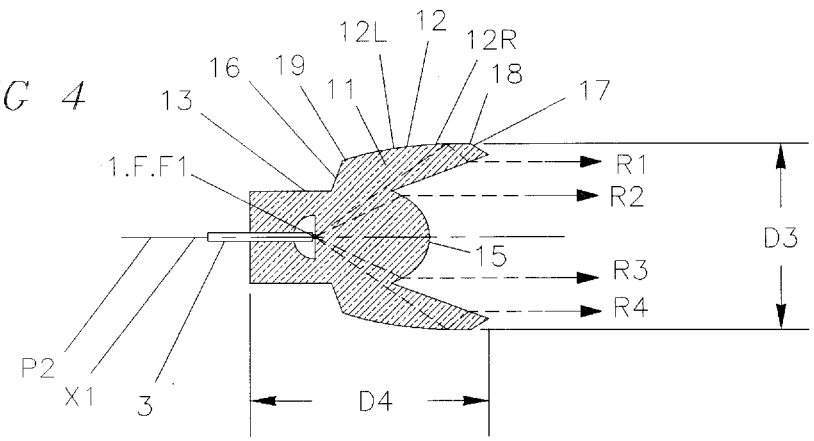
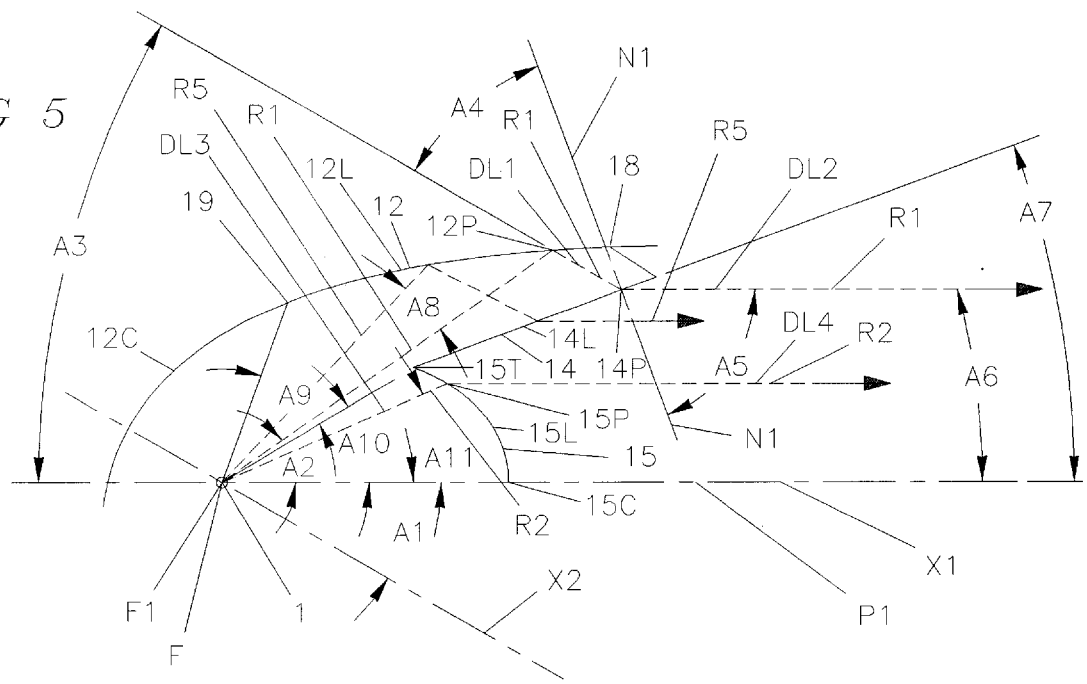
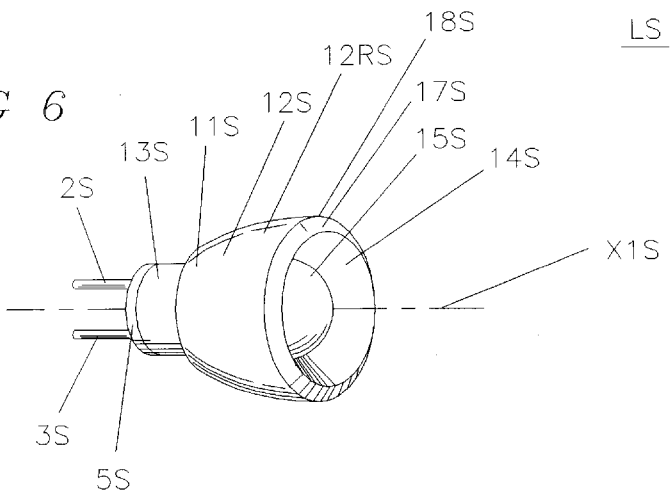

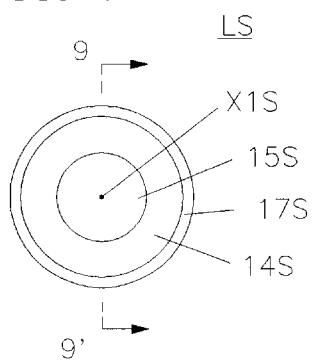
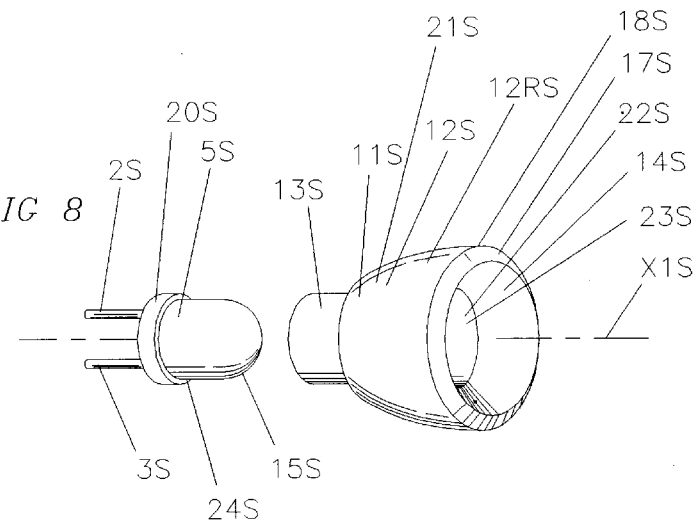
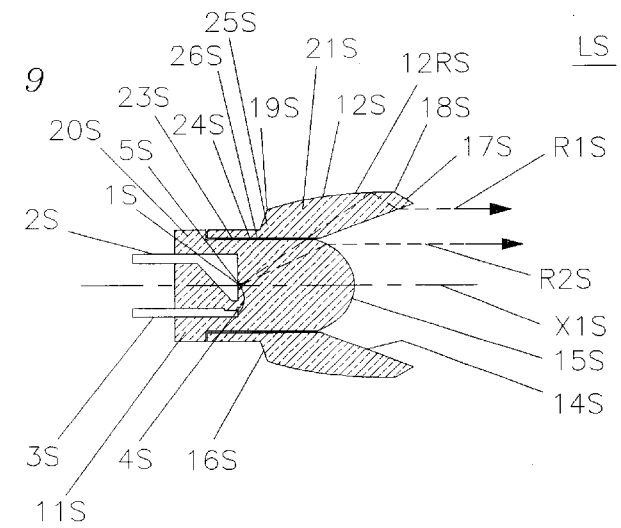
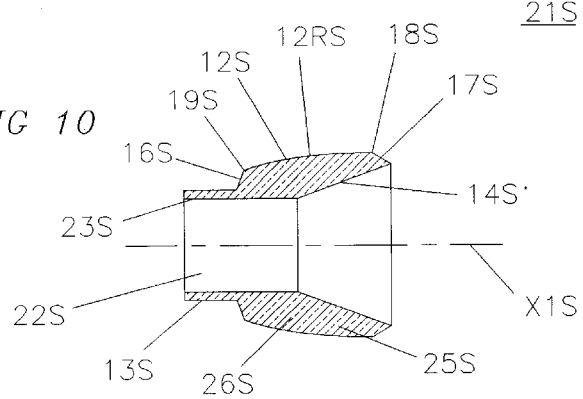

PARABOLIC AXIAL LIGHTING DEVICE

BACKGROUND OF INVENTION

1. Field of the Invention

The present invention relates to a lighting device which is compact and efficient. It can be employed anywhere a concentrated light beam is necessary. The present invention would typically be used in a flashlight, a caution light, a parallel beam light source, a reading light, a display or any of a multiplicity of lighting devices.

2. Description of Prior Art

A prior art design can be found in U.S. Pat. No. 4,698,730 issued to Sakai, et al. for a light emitting diode with its principles shown in FIG. 11 of the current application. In the FIG. 11 lighting device LP, light emitting diode (LED) element 1P is mounted at the top of a first lead frame 2P and electrically connected to a second lead 3P by a connecting wire 4P. These elements comprise a typical light emitting diode (LED) light source 5P. As described in the referenced prior art patent LED element 1P emits light forming a spatial radiation pattern that includes both forward and side emitted light. The forward emitted light generally includes light emitted within a range of divergence that includes angles of divergence between 0 and 30 degrees from the optical axis XP of the device. The side emitted light generally includes light emitted within a range of divergence that includes angles of divergence between 30 and 90 degrees from the optical axis XP of the device. In lighting device LP light source 5P is encapsulated in transparent resin 6P. Transparent resin 6P forms two optical light directing surfaces including lens 7P and peripheral reflective surface 8P both of which are symmetrical about axis XP. Both optical surfaces are surfaces of revolution about axis XP. Peripheral reflective surface 8P is a classical parabolic reflector developed about axis XP and shaped to reflect side emitted light to direct it to become parallel to axis XP. As a result of peripheral reflective surface 8P, typical side emitted light ray R1P emitted from LED element 1P intersects peripheral reflective surface 8P and is reflected such that it becomes parallel to axis XP. Planer end portion 9P is perpendicular to reflected light ray R1P and axis XP so planer end portion 9P does not refract reflected light ray R1P or change its direction. Interior wall 10P is parallel to both axis XP and reflected light ray R1P so it also does not refract or redirect light. Lens 7P refracts forward emitted light to direct it to become more parallel to axis XP. As a result of lens 7P, typical forward emitted light ray R2P emitted from LED element 1P intersects lens 7P and is refracted to emerge parallel to axis XP. Lighting device LP has an outside diameter of dimension D1 and a length of dimension D2.

In the referenced prior art design, the side emitted light is not refracted or redirected after its reflection at peripheral reflective surface 8P. Prior art contours and orients peripheral reflective surface 8P so that the reflected light becomes parallel to axis XP. The reflected light leaves the device without redirection through a "planar upper surface". The referenced prior art design functions, however, it represents an unnecessarily large and massive lighting device. The lighting device becomes large because peripheral reflective surface 8P is a parabola contoured to reflect the side light to become parallel to axis XP and also to collect the side light emitted within a wide range of angular divergence from the optical axis XP. The undesirably large size of lighting device LP can be reduced but the available methods result in an unacceptable loss in efficiency. The size of the peripheral reflective surface 8P alone can be reduced by collecting a reduced angular range of side emitted light but because less light is collected, the efficiency of the device will correspondingly be reduced. The size of the entire optical portion of the lighting device LP including the peripheral reflective surface 8P can be proportionally reduced but because LED element 1P will, if it is to maintain its light output maintain its size the ratio of peripheral reflective surface 8P size verses LED element size will be reduced. A reduction in this size ratio reduces the ability of the peripheral reflective surface 8P to accurately redirect the side light resulting one again in a loss in efficiency.

Therefore, in a high efficiency embodiment the referenced prior art design is larger than desired. The large size increases manufacturing costs and due to shrinkage during molding, reduces the precision of the optical surfaces. Furthermore, the larger dimensions of the prior art design require the emitted light to pass through thick sections of transparent resin 6P before exiting the lighting device and consequently experience unacceptable attenuation due to related transmission losses. The large prior art lighting device will also not he acceptable for many uses due to the size limitation of many products.

OBJECT OF THE INVENTION

A main object of the present invention is to provide a lighting device of a more compact design then prior art.

Another object of the present invention is to provide a lighting device with increased efficiency over prior art.

Another object of the present invention is to create a lighting device with reduced size and weight.

Another object of the present invention is to create a lighting device that concentrates light about an axis.

Another object of the present invention is to create a lighting device which has reduced mass and which therefore, can be more accurately cast into the precise shape necessary to achieve the highest efficiency of optical design.

SUMMARY OF THE PRESENT INVENTION

According to the present invention a light source comprising a light emitting diode LED element mounted on a lead frame and encapsulated within a transparent resin has a high percentage of its emitted light collected into a light beam concentrated about its axis of revolution by a combination of optical surfaces. The standard light emitting diode element emits light forming a spatial radiation pattern which as described in the referenced prior art can be considered to include a side emitted light zone and a forward emitted light zone. Most of the light energy emitted by the LED element is found within these two zones and the two zones are usually located within a hemisphere. The emitted light is substantially symmetrical about a pattern axis. The transparent resin forms three optical surfaces each which alters the direction of the emitted light. Usually each of the optical surfaces are surfaces of revolution about a common axis of revolution. The first optical surface is a lens which refracts the forward emitted light to direct it to become more parallel to the axis of revolution of the device. The second optical surface, a reflector means, is a peripheral reflector which reflects and directs the side emitted light to intersect the third optical surface, a refractor means and to optionally converge towards the axis of revolution. Generally in both the present invention and in the referenced prior art the reflector is developed by rotating a line about an axis of revolution. If the reflector is a parabolic surface the line is a parabolic line curve. The parabolic line curve of the referenced prior art is developed about the axis of revolution. The parabolic line curve of the present invention is developed about a line which is not the axis of revolution. Line curves which are not parabolic in shape can also be employed to develop the peripheral reflector in the present invention. Embodiments which construct the peripheral reflector by rotating a straight line about the axis of revolution can also be employed in the present invention.

The refractor means is located to intersect the converging light previously reflected by the second optical surface. In the present invention, the contour of the refractor must be designed to cooperate with the contour of the reflector to redirect the converging light so that it emerges from the lighting device more parallel to the axis of revolution of the lighting device then it was when it was first emitted from the LED element. It should be noted that the present lighting device always concentrates the side emitted light and usually the forward emitted light as well about the axis of revolution. It also brings the side emitted light towards parallelism with itself. Furthermore it brings the forward emitted light towards parallelism with itself and towards parallelism with the side emitted light that has been reflected and refracted.

The reflector (optic 2) and refractor (optic 3) combination of the present invention cooperate to first reflect and direct the light to converge towards the axis of revolution of the lighting device and then refract and redirect the light to emerge substantially parallel to the axis of revolution. This combination achieves the same concentrating effect upon the side emitted light as the single optic parabolic reflector of the referenced prior art, however, the combination of two cooperating optics permit the present design to be both more compact and more efficient then prior art.

The present design is more compact, more precise and more efficient then prior art. It is also less expensive to produce. These advantages will be apparent from the detailed description of the present invention.

BRIEF DESCRIPTION OF THE DRAWINGS

FIG. 1 is a perspective view of lighting device L1 according to a first embodiment of the present invention.

FIG. 2 is a front view of the FIG. 1 lighting device.

FIG. 3 is a cross-sectional view of the FIG. 2 lighting device taken across line 3-3' of FIG. 2.

FIG. 4 is a cross-sectional view of the FIG. 2 lighting device taken across line 4-4' of FIG. 2.

FIG. 5 is an enlarged diagrammatic line drawing of a portion of the FIG. 3 drawing showing the contour of portions of the reflector, refractor and lens.

FIG. 6 is a perspective view of an alternate embodiment of the lighting device according to the present invention.

FIG. 7 is a front view of the FIG. 6 lighting device.

FIG. 8 is a perspective view of the FIG. 6 lighting device with the light source separated from the sleeve.

FIG. 9 is a cross-sectional view of the FIG. 7 lighting device taken across line 9-9' of FIG. 7.

FIG. 10 is a view of the sleeve removed from the FIG. 9 cross-sectional view.

DETAILED DESCRIPTION

Figure 11:
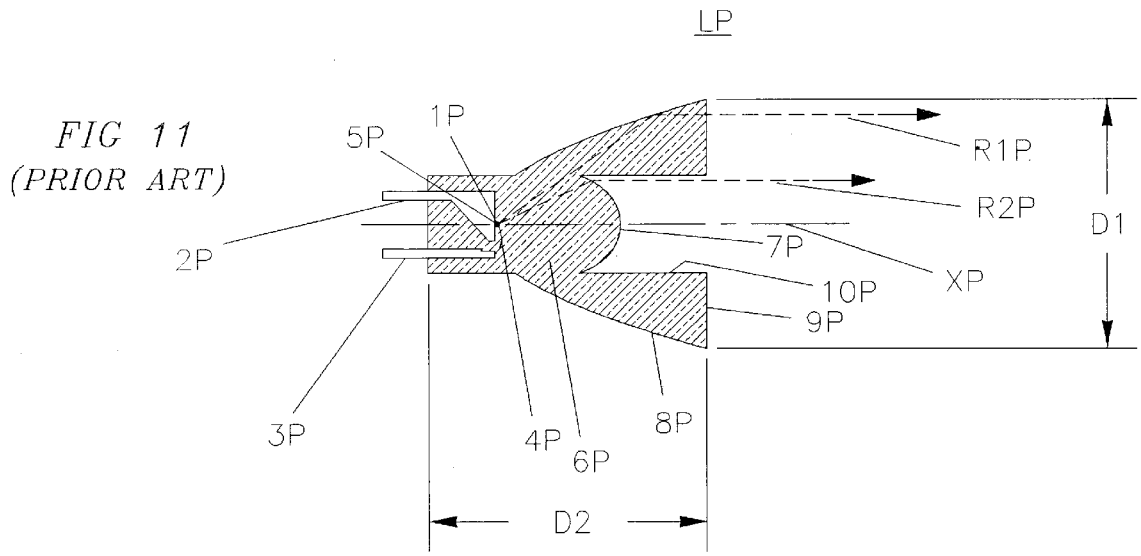
FIG. 11 is a cross-sectional view of lighting device LP detailing a prior art design.

Referring to FIGS. 1 thru 5, a first embodiment of the present invention will be explained hereinafter. FIGS. 1 and 2 are perspective and front views of lighting device L1. FIG. 3 is a sectional view of lighting device L1 taken across line 3-3' of FIG. 2 and FIG. 4 is a sectional view taken across line 4-4' of FIG. 2. Lighting device L1 includes typical LED light source 5 similar to light source 5P previously described in prior art FIG. 11. Looking at FIGS. 3 and 4 of the present application light source 5 includes LED element 1, mounted at the top of a first lead frame 2 and electrically connected to a second lead 3 by a connecting wire 4. Lead frame 2 and lead 3 provide a means to connect a source of electrical power to light source 5. LED element 1 is encapsulated in a light transmitting medium 11 which is shaped to form reflective surface 12, hub 13, refractive surface 14 and lens 15. Light transmitting medium 11 is usually a resin but can be any of a number of transparent substances including epoxy, acrylic plastic, etc. Rear transition surface 16 connects reflective surface 12 to hub 13 and transition surface 17 connects refractive surface 14 to reflective surface 12. Reflective surface 12 is vacuum metallized with reflective coating 12R to assure the efficient reflection of light. However, even without reflective coating 12R, due to total internal reflection as described in the classical laws of physics most of the light impinging on reflective surface 12 would reflect efficiently. Reflective surface 12 extends from intersection line 18 to intersection line 19. Although not mandatory for all embodiments reflective surface 12, refractive surface 14 and lens 15 are usually symmetrical both about axis of revolution X1 and reference plane P1. LED element 1 is usually coincident with axis of revolution X1 and reference plane P1. FIG. 5 is a diagrammatic line drawing showing a portion of the contours of reflective surface 12, refractive surface 14 and lens 15 removed from FIG. 3. FIG. 5 shows the construction of reflective surface 12 and the path of typical forward and side emitted light rays as they pass through lighting device L1. Parabolic line 12L is the intersection line of reference plane P2 and reflective surface 12. Parabolic line 12L is a segment of a classical two dimensional parabolic line curve 12C developed about both focal point F and parabolic line axis X2. Reflective surface 12 like prior art, is a parabolic surface. Reflective surface 12 is developed by rotating parabolic line 12L about axis of revolution X1. Axis of revolution X1 intersects parabolic line axis X2 or reference plane P1 to form angle of intersection A1. This is different from prior art in which the axis of revolution and the parabolic line axis were coincident. LED element 1 like prior art is at the focal point F of parabolic line 12L. LED element 1 can be positioned at other locations relative to focal point F in order to alter the intensity or direction of the beam emerging from lighting device L1. This modification in the location of LED element 1 would still employ the concepts of the present invention.

It should be noted that for the present application a light ray and a reference line both located in a common plane or two light rays in a common plane or a light ray and a plane are never perfectly parallel. They may be extremely close to parallel but upon being infinitely extended in all directions they will eventually intersect to form a very small included angle of intersection. If a light ray is directed to bring towards parallelism that light ray and a line located in a common plane then that light ray or equivalently the directional line indicating the direction along which that light ray proceeds is considered to have been directed to intersect the line at a reduced included angle of intersection. If a light ray is converging towards a line and the light ray is directed to reduce that convergence—or bring towards parallelism the light ray and the line—then the included angle of intersection between the light ray and the line will be reduced.

Similarly if a light ray is diverging from a line and the light ray is directed to reduce that divergence—or equivalently bring towards parallelism the light ray and the line—then the included angle of intersection between the light ray and the line will be reduced. These concepts apply equally when two light rays or a light ray and a plane are considered. Finally, within this application light is to be considered as comprising a multiplicity of typical light rays. Disclosures relating to the path of a light ray which is typical of side emitted light apply to other similar side emitted light rays as well. Additionally, disclosures relating to the path of a light ray which is typical of forward emitted light apply to other similar forward emitted light rays as well.

Referring to the present invention and looking especially at FIG. 5, light ray R1 which is typical of side emitted light is emitted from LED element 1 diverging from axis of revolution X1 as well as reference plane P1 at angle A2. Light ray R1 intersects reflective surface 12 at parabolic line 12L at point 12P where it is reflected. According to basic optics with a parabolic reflector shaped according to parabolic line 12L light ray R1 is directed to become parallel to parabolic line axis X2. Since parabolic line axis X2 intersects both axis of revolution X1 and reference plane P1 forming included angle A1 reflected light ray R1 will converge towards both axis of revolution X1 and reference plane P1. Reflected light ray R1 proceeds along a direction identified by a directional line DL1 parallel to parabolic line axis X2 and passing through point 12P. If extended directional, line DL1 would intersect both axis of revolution X1 and reference plane P1 forming an angle of intersection A3 which as previously described would be equal to angle of intersection A1. Reflected light ray R1 has additionally through reflection been directed to intersect refractive surface 14 at point of intersection 14P. It also intersects the normal line N1 to refractive surface 14 at point 14P to form angle of intersection A4. According to Snells law of optics light ray R1 will be refracted and redirected to emerge from refractive surface 14 at a determined angle A5 relative to normal line N1. The exact angle of intersection A4 between normal line N1 and reflected light ray R1 will establish both angle A5 and the geometrical relationship between refracted light ray R1 and axis of revolution X1. Refracted light ray R1 will after refraction proceed along a new directional line DL2 which upon being infinitely extended will intersect axis of revolution X1 or reference plane P1 to form angle of intersection A6 which due to the construction of lighting device L1 is less than angle of intersection A3. Thus, refractive surface 14 has reduced the convergence of reflected light ray R1 relative to axis of revolution X1. Reflective surface 12 and refractive surface 14 have cooperated to bring light ray R1 towards parallelism with axis of revolution X1. They have cooperated to reduce the angle of intersection from a magnitude equal to that of angle of intersection A3 to a magnitude equal to that of angle of intersection A6. Angle A6 is also less than angle A2 thus the combination of reflective surface 12 and refractive surface 14 has also reduced the divergence of light ray R1 about axis of revolution X1. Since light ray R1 is typical of side emitted light other side emitted light will similarly have its divergence about axis of revolution X1 reduced. Many applications require a high intensity concentrated output light beam and embodiments of the present invention for those applications will configure refractive surface 14 so that refracted light ray R1 emerges from refractive surface 14 substantially parallel to axis of revolution X1 with angle of intersection A6 substantially equal to zero degrees. This embodiment is shown in FIG. 5 wherein angle A1 is 30 degrees and the angle of intersection A7 between refractive surface 14 and both axis of revolution X1 and reference plane P1 is calculated to make angle A6 substantially agree to zero degrees using the index of refraction for light transmitting medium 11 and the basic laws of optics. Other applications not requiring a high intensity light beam but needing a wide beamspread may employ embodiments which configure refractive surface 14 to increase the concentration of light about axis of revolution X1 but not attempt to make the light totally parallel. These embodiments will configure refractive surface 14 to bring towards parallelism refracted light ray R1 and axis of revolution X1, however, they will not attempt to bring all the way to parallelism light ray R1 and axis of revolution X1. The concentration of the emerging light beam can alternatively be modified by changing the shape of reflective surface 12.

In FIG. 5 line 14L is formed at the intersection of reference plane P2 and refractive surface 14. Refractive surface 14 is conical in shape. It is developed by rotating line 14L about axis of revolution X1. Line 14L is located about LED element 1, or focal point F or other points depending upon the design parameters of the required output beam pattern.

Referring again to FIG. 5, light ray R5 which was not shown in FIG. 3 represents a second typical light ray of side light emitted by LED element 1. Light ray R5 diverges from light ray R1 by angle A8. According to the same principles as previously described for light ray R1, light ray R5 is first reflected and then refracted to emerge substantially parallel to axis of revolution X1. This makes refracted light ray R5 substantially parallel to refracted light ray R1. Therefore, lighting device L1 has redirected both light ray R1 and light ray R5 to reduce the divergence between these light rays or to bring them towards parallelism.

If refractive surface 14 were not included in the design or if no refraction took place at point of intersection 14P then reflected light ray R1 would converge upon and intersect axis of revolution X1 forming angle of intersection A3 equal in magnitude to angle of intersection A1. The present invention includes refractive surface 14 to reduce the angle of intersection A3 between reflected light ray R1 and axis of revolution X1. Refractive surface 14 could also be considered as functioning to reduce the convergence of reflected light ray R1 about axis of revolution X1 as well as reference plane P1. Refractive surface 14 could also be considered as functioning to bring towards parallelism reflected light ray R1 and other side emitted light rays similar to light ray R1.

Looking again especially at FIG. 5 light ray R1 is typical of the side emitted light from light source 5. This side emitted light is emitted from light source 5 diverging at angle A2 from both axis of revolution X1 and reference plane P1. Side emitted light generally includes the light emitted by light source 5 within angle A9 and it is typically reflected along parabolic line 12L between intersection line 18 and intersection line 19. For the FIG. 5 present embodiment angle A9 has a magnitude of approximately 40 degrees, however, its magnitude can change to comply with particular design parameters. Referring to FIG. 3, it should be noted that light ray R1 is on a first side of reference plane P1. Light ray R1 is reflected by reflective surface 12 at point 12P then refracted by refractive surface 14 at point of intersection 14P all of which are also on the same first side of reference plane P1. It can be seen that a similar relationship exists among the second side of reference plane P1, second typical side emitted light ray R4, its intersection point on refractive surface 14 and its intersection point on reflective surface 12. Lighting device L1 is symmetrical both about axis of revolution X1 and reference plane P1. The optics about axis of revolution X1 are part of the same surface of revolution and, therefore, function identically regardless of the rotational location about axis of revolution X1. Generally, light ray R4 is directed in a like fashion to that described for light ray R1. Since both light ray R1 and light ray R4 are brought towards parallelism with axis of revolution X1, it can be easily seen that they are brought towards parallelism with each other. Actually, the present design brings towards parallelism all of the side emitted light as typified by light rays R1, R4, and R5.

Actually, the present embodiment brings towards parallelism all of the side light emitted within angle A9 regardless of the side lights rotational location about axis of revolution X1. The present embodiment is symmetrical about axis of revolution X1, however, alternate designs of the present invention could have different optical contours relative to their rotational location about axis of revolution X1 and still employ the concepts of the present invention.

Forward emitted light generally includes light emitted by light source 5 within angle A10 about axis of revolution X1 and is typically refracted by lens 15. Angle A10 extends from the center point 15C of lens 15 on axis of revolution X1 to the top point 15T of lens 15. For the present embodiment light emitted by LED element 1 within angle A10 in all rotational directions about axis of revolution X1 represents the forward emitted light. Angle A10 for the present embodiment is approximately 30 degrees. Angle A10 can vary depending upon the design requirements. Light ray R2 which is typical of forward emitted light emerges from LED element 1 diverging at angle A11 relative to axis of revolution X1. Forward emitted light ray R2 proceeds along directional line DL3 and intersects lens 15 at point 15P along lens contour line 15L where it is refracted. Lens contour line 15L is formed at the intersection of lens 15 and reference plane P2. Lens 15 is developed by rotating lens contour line 15L about axis of revolution X1. In the present embodiment lens 15 is aspheric and LED element 1 is at focal point F1 of lens 15 so that refracted light ray R2 emerges substantially parallel to axis of revolution X1. Refracted light ray R2 proceeds along directional line DL4 which is substantially parallel to axis of revolution X1. Alternate embodiments may require a less intense but larger beamspread. In these alternate embodiments, the contour of lens 15 can be altered or the location of LED element 1 relative to focal point F1 can be shifted to alter the refraction of light ray R2 such that the refraction at lens 15 reduces the divergence of light ray R2 about axis of revolution X1 but does not attempt to make light ray R2 parallel to axis of revolution X1.

Light ray R2 is refracted by lens 15 at point 15P both which are on a first side of reference plane P1. Referring to FIG. 3, it can be seen that a similar relationship exists among the second side of reference plane P1, second typical forward emitted light ray R3 and its intersection point on lens 15. Lighting device L1 is symmetrical about both axis of revolution X1 and reference plane P1. Hence, the optics about axis of revolution X1 are part of the same surface of revolution and, therefore, function identically regardless of the rotational location about axis of revolution X1. Therefore, light ray R3 is directed in a like fashion to that described for light ray R2. Since both light ray R2 and light ray R3 are brought towards parallelism with axis of revolution X1, it can be easily seen that they are brought towards parallelism with each other. Since as previously described the side light is brought towards parallelism with axis of revolution X1 it is further easily seen that the forward emitted light is brought towards parallelism with the side emitted light. Actually, the design brings towards parallelism all of the forward emitted light emitted within angle A10. The FIG. 5 embodiment is symmetrical about axis of revolution X1, however, alternate designs of the present invention could have different optical contours about axis of revolution X1 and still employ the concepts of the present invention. Light rays R2 and R3 are typical of forward emitted light emitted from LED element 1. Other forward emitted light would be directed similarly by lens 15.

Referring back to FIGS. 4 and 5 and the side emitted light previously described. Light ray R1 can optionally be considered to represent a first portion of the side light and light ray R2 can optionally be considered to represent a second portion of the side light. Each of these light rays is diverging from axis of revolution X1 such that they form an angle of intersection A2 with axis of revolution X1. Angle A2 exceeds angle A10 which is 30 degrees. Thus light rays R1 and R2 are diverging from each other such that they form an angle of intersection which exceeds 60 degrees and the optics of lighting device L1 directs both light ray R1 and light ray R2 to reduce this divergence. Other embodiments of the lighting device can incorporate the present invention even if they do not bring towards parallelism all portions of the side light, however, the efficiency of the lighting device is generally improved by collecting and directing as much of the side light as possible.

Finally, in lighting device L1 reflective surface 12, refractive surface 14 and lens 15 were all developed by rotating lines about axis of revolution X1. This is an easily constructed embodiment of the present invention, however, it is also possible to construct reflective surface 12, refractive surface 14 and lens 15 without rotating lines about axis of revolution X1. In those embodiments of the present invention, axis of revolution X1 would be replaced by an axis which could serve as a reference line for the optical surfaces and the emitted light.

An alternate embodiment of the present invention is disclosed in FIGS. 6 thru 10. FIGS. 6 and 7 are perspective and front views of sleeve lighting device LS. FIG. 8 is a perspective view of sleeve lighting device LS with its LED lamp 20S removed. FIG. 9 is a sectional view of sleeve lighting device LS taken across line 9–9' of FIG. 7. FIG. 10 is a drawing of the sleeve 21S removed from the FIG. 9 drawing. Sleeve lighting device LS functions optically comparably to lighting device L1 of FIG. 1, however, sleeve lighting device LS is manufactured by assembling a LED lamp 20S and sleeve 21S rather than the unitized design as described for lighting device L1. There are numerous ways to manufacture the present invention in which its light source, reflector, refractor and optional lens are combined. Sleeve lighting device LS is one of these numerous ways to manufacture the present invention however other embodiments which use the optical concepts herein disclosed are also to be considered as employing the present invention. Many of the elements of sleeve lighting device LS function optically the same as the corresponding elements found in lighting device L1. Therefore in order to simplify the explanation of lighting device LS for those corresponding elements the suffix S has been added to the drawing designations found in FIGS. 1 thru 5 relating to lighting device L1. Elements of lighting device LS which were not part of lighting device L1 are given new numerical designations, however, they also include the suffix S.

Lighting device LS is especially useful because it employs a commercially available type T 1 3/4 LED lamp 20S that is obtainable in a variety of colors and electrical characteristics. This LED lamp is similar to that shown in the referenced prior art U.S. Pat. No. 4,698,730 issued to Sakai, et al. and would emit light with a spatial radiation pattern as shown in FIG. 9 of that patent. Other commercial LED lamps can also be incorporated into the present invention.

Referring now to FIGS. 6 thru 10 but especially FIG. 8 which is a disassembled perspective view of sleeve lighting device LS, sleeve lighting device LS is comprised of LED lamp 20S and sleeve 21S. Sleeve 21S includes a hollow opening 22S enclosed by a wall 23S. LED lamp 20S is assembled into hollow opening 22S to create sleeve lighting device LS. FIGS. 6 and 7 show perspective and front views of the assembled sleeve lighting device LS. FIG.9 is a sectional view of sleeve lighting device LS taken across line 9–9' of FIG.7. Referring to FIG.9 LED lamp 20S comprises light source 5S. Light source 5S includes LED element 1S mounted at the top of a first lead frame 2S and electrically connected to a second lead 3S by a connecting wire 4S. LED element 1S coincident with axis X1. Light source 5S is encapsulated in a lamp light transmitting medium 11S which forms lamp body 24S and lens 15S. Lamp light transmitting medium 11S is usually a clear transparent resin and can be any of a number of substances including epoxy, acrylic plastic, etc.

Referring to FIG. 10 which is a drawing of sleeve 21S removed from the FIG. 9 drawing, sleeve 21S is manufactured of a sleeve light transmitting medium 25S usually of the same substance as lamp light transmitting medium 11S. Generally, if lamp light transmitting medium 25S is of a different material then sleeve light transmitting medium 11S it is desirable, in order to reduce unwanted refraction, that their indicies of refraction remain substantially equal. Sleeve light transmitting medium 25S is formed to comprise reflective surface 12S, hub 13S and refractive surface 14S. Rear transition surface 16S connects reflective surface 12S and hub 13S and transition surface 17S connects refractive surface 14S to reflective surface 12S. Reflective surface 12S is metallized with reflective coating 12RS to assure the efficient reflection of light. Reflective surface 12S extends from intersection line 18S to intersection line 19S. Reflective surface 12S and refractive surface 14S are symmetrical about axis of revolution X1S. Hollow opening 22S is formed by wall 23S. Sleeve 21S is symmetrical about axis of revolution X1S. During assembly LED lamp 20S is inserted into hollow opening 22S. Wall light transmitting medium 26S with an index of refraction exceeding 1.1 is usually placed between lamp body 24S and wall 23S. Wall light transmitting medium 26S can be any of a number of transparent substances including epoxy, acrylic plastic, etc. The index of refraction of wall light transmitting medium 26S is generally selected to substantially equal the index of refraction of sleeve light transmitting medium 25S to reduce unwanted refraction. Once assembled lighting device LS optically functions comparably to lighting device L1 as previously described.

Figure 12:
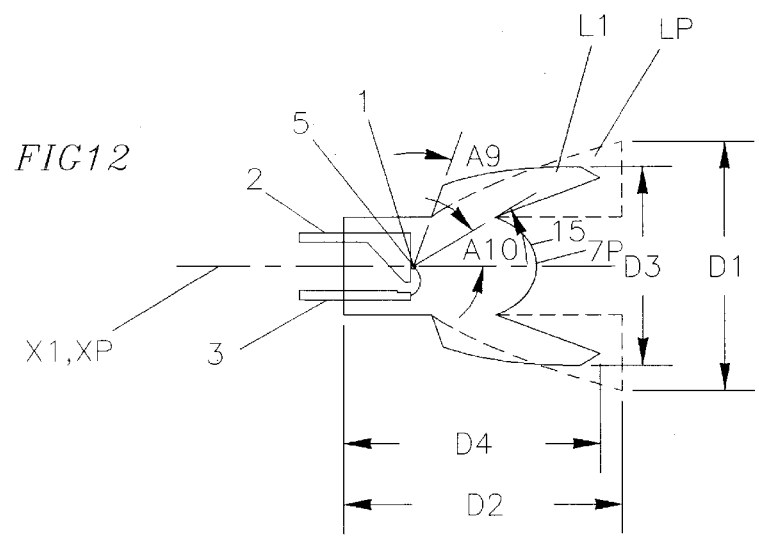
FIG. 12 is a diagrammatic solid line drawing of the FIG. 3 drawing contour overlaying a diagrammatic dashed line drawing of the prior art FIG. 11 drawing contour.

FIG. 12 shows the present design represented by lighting device L1 using solid lines overlaying the referenced prior art design represented by lighting device LP from FIG. 11 using dotted lines. Both designs are configured to collect equal amounts of forward emitted light represented by angle A10. Also both designs are configured to collect equal amounts of side emitted light represented by angle A9. It can be seen from FIG. 12 that dimensions D1 and D2 for prior art lighting device LP are both larger then the corresponding dimensions D3 and D4 of lighting device L1 of the present invention. The reduced size of lighting device L1 makes it less expensive to manufacture and more precise when casting. The increased precision of the optical surfaces of lighting device L1 permit it to more accurately direct the light resulting in improved efficiency.

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. For instance, although this disclosure centered on visible light, the concepts described and the term light are meant to include all electromagnetic radiated energy including the infrared portion of the spectrum.

It is to be understood, therefore, that within the scope of the appended claims, the invention may be practiced otherwise than as specifically set forth herein.

What is claimed is:

1. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

a reflective surface connected to said light source disposed intersecting said side light, said reflective surface comprising a substantially parabolic line, said substantially parabolic line having a parabolic line axis, said parabolic line axis substantially intersecting said reference axis, said reflective surface including a reflecting means for forming a reflected light having a convergence about said reference axis; and a refractive surface connected to said reflective surface disposed intersecting said reflected light, said refractive surface including a refracting means for bringing said reflected light towards parallelism with said reference axis.

2. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

said light emitting diode element encapsulated in a lamp light transmitting medium, said lamp light transmitting medium comprising a resin having an index of refraction exceeding 1.1;

a reflective surface connected to said light source disposed intersecting said side light, said reflective surface comprising a substantially parabolic line, said substantially parabolic line having a parabolic line axis, said parabolic line axis substantially intersecting said reference axis, said reflective surface including a reflective means for forming a reflected light having a convergence about said reference axis; and a refractive surface connected to said reflective surface disposed intersecting said reflected light, said refractive surface including a refracting means for bringing said reflected light towards parallelism with said reference axis.

3. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

said light emitting diode element encapsulated in a lamp light transmitting medium, said lamp light transmitting medium comprising a resin having an index of refraction exceeding 1.1;

a refractive surface;

a reflective surface;

said lamp light transmitting medium forming said reflective surface and said refractive surface;

said reflective surface connected to said light source disposed intersecting said side light, said reflective surface comprising a substantially parabolic line, said substantially parabolic line having a parabolic line axis, said parabolic line axis substantially intersecting said reference axis, said reflective surface including a reflective means for forming a reflected light having a convergence about said reference axis; and said refractive surface connected to said reflective surface disposed intersecting said reflected light, said refractive surface including a refractive means for bringing said reflected light towards parallelism with said reference axis.

4. A lighting device including:

a light source;

a source of electrical power;

said light source further including a light emitting diode element;

a connecting means for connecting said source of electrical power to said light source;

said light emitting diode element coincident with a reference axis and emitting a forward light having a forward divergence about said reference axis;

said light emitting diode element encapsulated in a lamp light transmitting medium, said lamp light transmitting medium comprising a resin having an index of refraction exceeding 1.1;

a lens surface;

said lens surface formed of said lamp light transmitting medium and disposed about said light source intersecting said forward light, said lens surface including a lens means for refracting and bringing said forward light towards parallelism with said reference axis;

said light emitting diode element further emitting a side light having a side divergence about said reference axis;

said side divergence larger than said forward divergence;

a reflective surface connected to said light source disposed intersecting said side light, said reflective surface comprising a substantially parabolic line, said substantially parabolic line having a parabolic line axis, said parabolic line axis substantially intersecting said reference axis, said reflective surface including a reflective means for forming a reflected light having a convergence about said reference axis; and a refractive surface connected to said reflective surface and disposed intersecting said reflected light, said refractive surface including a refractive means for bringing said reflected light towards parallelism with said reference axis.

5. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

said light emitting diode element encapsulated in a lamp light transmitting medium, said lamp light transmitting medium comprising a resin having an index of refraction exceeding 1.1;

a refractive surface;

a reflective surface;

a sleeve means formed of a sleeve light transmitting medium;

said sleeve means comprising said refractive surface and said reflective surface, said sleeve means further comprising a wall forming a hollow portion, said hollow portion receiving said light source;

said reflective surface connected to said light source disposed intersecting said side light, said reflective surface comprising a substantially parabolic line, said substantially parabolic line having an parabolic line axis, said parabolic line axis substantially intersecting said reference axis, said reflective surface including a reflective means for forming a reflected light having a convergence about said reference axis; and said refractive surface connected to said reflective surface disposed intersecting said reflected light, said refractive surface including a refractive means for bringing said reflected light towards parallelism with said reference axis.

6. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

a reflective surface formed of a rotary movement of a substantially parabolic line about said reference axis;

said reflective surface connected to said light source disposed intersecting said side light, said substantially parabolic line having a parabolic line axis, said parabolic line axis substantially intersecting said reference axis, said substantially parabolic line having a focal point, said light emitting diode element located substantially at said focal point; and a refractive surface connected to said reflective surface disposed intersecting said reflected light, said refractive surface including a refractive means for bringing said reflected light towards parallelism with said reference axis.

7. The lighting device according to any of claims 1, 2, 3, 5 or 6 which further includes:

a lens surface;

said light emitting diode element further emitting a forward light having a forward divergence about said reference axis;

said forward divergence less than said side divergence; and said lens surface formed of a light transmitting medium connected to said light source and disposed about said light source intersecting said forward light, said lens surface including a lens means for refracting said forward light and reducing said forward divergence of said forward light about said reference axis.

8. The lighting device according to any of claims 1, 2, 4 or 6 which further includes:

a sleeve means formed of a sleeve light transmitting medium; and said sleeve means comprising said refractive surface and said reflective surface, said sleeve means further comprising a wall forming a hollow portion, said hollow portion receiving said light source.

9. The lighting device according to any of claims 1, 2, 3 or 6 which further includes:

a lens surface;

said light emitting diode element further emitting a forward light having a forward divergence about said reference axis;

said forward divergence smaller than said side divergence;

said lens surface formed of a light transmitting medium coupled to said light source and disposed intersecting said forward light, said lens surface including a lens means for refracting said forward light and reducing said forward divergence about said reference axis;

a sleeve means formed of a sleeve light transmitting medium;

said sleeve means comprising said refractive surface and said reflective surface, said sleeve means further comprising a wall forming a hollow portion, said hollow portion receiving said light source; and, a wall light transmitting medium with an index of refraction exceeding 1.1 between said wall and said light source.

10. The lighting device according to any of claims 1 thru 5 which further includes:

said reflective surface formed of a rotary movement of said substantially parabolic line about said reference axis.

11. The lighting device according to any of claims 1 thru 5 which further includes:

said reflective means comprising said substantially parabolic line having a focal point and said light emitting diode element located substantially at said focal point.

12. The lighting device according to any of claims 1 thru 6 which further includes:

said refractive means additionally for bringing said reflected light approximately to parallelism.

13. A lighting device according to any of claims 1 thru 6 which further includes:

said refractive means comprising said refractive surface having a conical contour.

14. A lighting device according to any of claims 1 thru 6 which further includes:

said refractive surface formed of a rotary movement of a line about said reference axis, said line intersecting said reference axis forming an acute angle.

15. A lighting device according to any of claims 1, 2 or 4 which further includes:

said reflective surface and said refractive surface formed of a light transmitting medium having an index of refraction exceeding 1.1.

16. A lighting device according to claim 4 which further includes:

said lens means comprising said lens surface having a substantially aspheric contour.

* * * * *